United States Patent
Jurchescu et al.

(10) Patent No.: US 10,256,407 B2
(45) Date of Patent: Apr. 9, 2019

(54) ORGANIC THIN FILM TRANSISTORS

(71) Applicant: WAKE FOREST UNIVERSITY, Winston-Salem, NC (US)

(72) Inventors: Oana Diana Jurchescu, Winston-Salem, NC (US); Peter James Diemer, Mocksville, NC (US)

(73) Assignee: Wake Forest University, Winston-Salem, NC (US)

( * ) Notice: Subject to any disclaimer, the term of this patent is extended or adjusted under 35 U.S.C. 154(b) by 0 days.

(21) Appl. No.: 15/876,596

(22) Filed: Jan. 22, 2018

(65) Prior Publication Data

US 2018/0159036 A1 Jun. 7, 2018

Related U.S. Application Data

(60) Continuation of application No. 15/375,251, filed on Dec. 12, 2016, now Pat. No. 9,882,128, which is a division of application No. 14/430,813, filed as application No. PCT/US2013/061463 on Sep. 24, 2013, now Pat. No. 9,530,975.

(60) Provisional application No. 61/704,875, filed on Sep. 24, 2012, provisional application No. 61/843,543, filed on Jul. 8, 2013.

(51) Int. Cl.
| | |
|---|---|
| *H01L 51/05* | (2006.01) |
| *H01L 51/00* | (2006.01) |
| *H01L 51/42* | (2006.01) |
| *H01L 51/44* | (2006.01) |

(52) U.S. Cl.
CPC ...... *H01L 51/0003* (2013.01); *H01L 51/0001* (2013.01); *H01L 51/0026* (2013.01); *H01L 51/0512* (2013.01); *H01L 51/0541* (2013.01); *H01L 51/0545* (2013.01); *H01L 51/42* (2013.01); *H01L 51/4253* (2013.01); *H01L 51/442* (2013.01); *H01L 2251/301* (2013.01); *H01L 2251/303* (2013.01); *Y02E 10/549* (2013.01); *Y02P 70/521* (2015.11)

(58) Field of Classification Search
CPC . H01L 51/05; H01L 51/0541; H01L 51/0545; H01L 51/0003; H01L 51/4253
See application file for complete search history.

(56) References Cited

U.S. PATENT DOCUMENTS

| | | | | |
|---|---|---|---|---|
| 2002/0090776 | A1* | 7/2002 | Nakata | ............. H01L 21/28185 438/216 |
| 2007/0063932 | A1* | 3/2007 | Nathan | ................ G09G 3/3233 345/76 |
| 2011/0186829 | A1* | 8/2011 | Burroughes | ........ H01L 51/0096 257/40 |

(Continued)

*Primary Examiner* — Phuc T Dang
(74) *Attorney, Agent, or Firm* — J. Clinton Wimbish; Nexsen Pruet, PLLC

(57) ABSTRACT

In one aspect, organic thin film transistors are described herein. In some embodiments, an organic thin film transistor comprises a source terminal, a drain terminal and a gate terminal; a dielectric layer positioned between the gate terminal and the source and drain terminals; and a vibrationally-assisted drop-cast organic film comprising small molecule semiconductor in electrical communication with the source terminal and drain terminal, wherein the transistor has a carrier mobility ($\mu_{eff}$) of at least about 1 cm$^2$/V·s.

19 Claims, 5 Drawing Sheets

(56) References Cited

U.S. PATENT DOCUMENTS

2012/0256137 A1* 10/2012 James ............... H01L 51/0003
252/500
2012/0319096 A1* 12/2012 Rinzler ............... B82Y 10/00
257/40

* cited by examiner

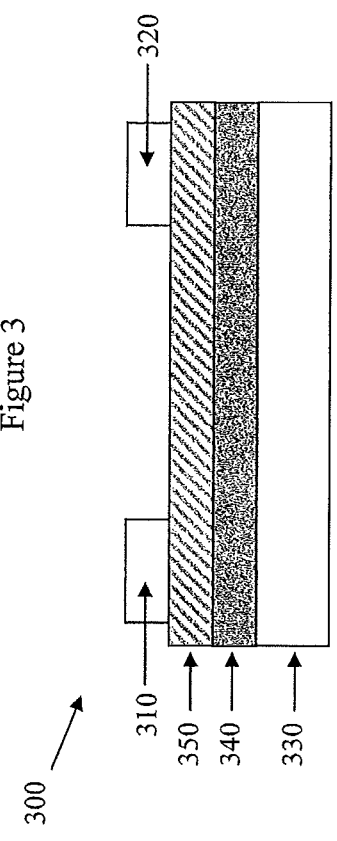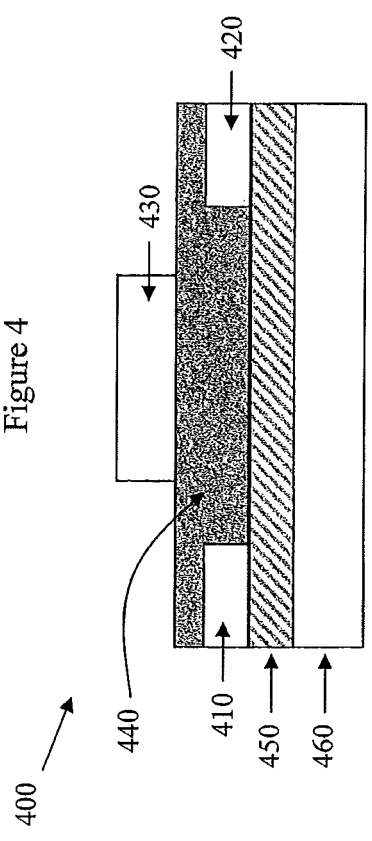

ORGANIC THIN FILM TRANSISTORS

RELATED APPLICATION DATA

The present application is a continuation application of U.S. patent application Ser. No. 15/375,251 which is a continuation of U.S. Pat. No. 9,882,128 issued Jan. 30, 2018 which is a divisional of U.S. Pat. No. 9,530,975 issued Dec. 27, 2016 which is a national stage application under 35 U.S.C. § 371 of International Application No. PCT/US2013/061463, filed Sep. 24, 2013, which hereby claims priority pursuant to 35 U.S.C. § 119(e) to U.S. Provisional Patent Application Ser. No. 61/704,875 filed Sep. 24, 2012 and U.S. Provisional Patent Application Ser. No. 61/843,543 filed Jul. 8, 2013, each of which is incorporated herein by reference in its entirety.

STATEMENT REGARDING FEDERALLY SPONSORED RESEARCH

This invention was made with government support under contract ECCS-1102275 awarded by the National Science Foundation. The government has certain rights in the invention.

FIELD

The present invention relates to organic thin film transistors and methods of making organic thin film transistors.

BACKGROUND

Organic electronic materials are finding increasing application in a variety of fields including displays, photovoltaics and other optoelectronic apparatus. Advantages of organic materials in electronic applications include increased processibility, general substrate compatibility and reduced complexity of device fabrication. However, commercialization of organic electronics is often hindered by insufficient device performance, poor reproducibility and limited device lifetime compared to inorganic devices. For example, an important transistor parameter is charge carrier mobility. Transistors incorporating soluble small molecule organic semiconductor single-crystal channel materials demonstrate high mobilities, generally ranging from 1 to 6 cm$^2$/Vs. In comparison, transistors of thin film organic semiconducting materials often have mobilities at least an order of magnitude less. Such a reduction in mobility effectively precludes the use of thin film organic semiconductors in fast switching transistor applications.

SUMMARY

In one aspect, organic thin film transistors are described herein which, in some embodiments, can demonstrate enhanced carrier mobility. An organic thin film transistor described herein comprises a source terminal, a drain terminal, a gate terminal and a dielectric layer positioned between the gate terminal and the source and drain terminals. A vibrationally-assisted drop-cast organic film comprising small molecule semiconductor is in electrical communication with the source terminal and drain terminal. In some embodiments, the transistor has a carrier mobility ($\mu_{eff}$) of at least about 1 cm$^2$/V·s. In some embodiments, $\mu_{eff}$ is at least about 3 cm$^2$/V·s. Additionally, a transistor described herein can have a threshold voltage ($V_T$) ranging from about −3V to 3V. Moreover, in some embodiments, a transistor described herein has a subthreshold swing (S) of less than about 1 V/dec.

In addition to the foregoing properties, a transistor described herein can demonstrate a significant reduction in trap density, $N_{it}$, at the interface of the vibrationally-assisted drop-cast organic film and dielectric layer. In some embodiments, for example, a transistor has a $N_{it}$ of less than 1E$^{12}$ cm$^{-2}$·eV$^{-1}$.

An organic thin film transistor described herein, in some embodiments, further comprises a work function alteration layer positioned between the vibrationally-assisted drop-cast organic film and at least one of the source terminal and drain terminal. In some embodiments, a work function alteration layer is positioned between both the source terminal and the organic film and the drain terminal and the organic film.

An organic thin film transistor described herein can further comprise a surface energy alteration layer positioned between the vibrationally-assisted drop-cast organic film and one or more dielectric layers of the transistor. In one embodiment, for example, a surface energy alteration layer is positioned between the vibrationally-assisted drop-cast organic thin film and the dielectric layer separating the source and drain terminals from the gate terminal. In some embodiments, a surface energy alteration layer is positioned between the vibrationally-assisted drop-cast organic thin film and a dielectric substrate.

Additionally, in some embodiments, the vibrationally-assisted drop-cast organic film of the transistor comprises crystalline grains of the small molecule semiconductor. The crystalline grains, in some embodiments, have an average size in at least one dimension greater than 30 μm. Moreover, in some embodiments, a small molecule semiconductor comprises one or more acenes.

In another aspect, methods of making an organic thin film transistor are described herein. In some embodiments, a method of making an organic thin film transistor comprises providing a source terminal and a drain terminal on a dielectric substrate and drop-casting an organic film on surfaces the source and drain terminals from a solution of a small molecule semiconductor, wherein the deposited solution is vibrated during evaporation of solution solvent. In some embodiments, the deposited solution is vibrated at a frequency ranging from about 50 Hz to about 1000 Hz. The dielectric substrate can also be vibrated during evaporation of the solvent of the deposited solution. The solvent of the deposited solution, in some embodiments, is evaporated at a rate ranging from about 5 μL/hr to 50 μL/hr.

Further, an electric field can be applied to the deposited solution during vibration of the solution and/or evaporation of the solution solvent. For example, electrically conductive plates can be arranged in a manner to place the deposited solution in an electrical field when a voltage is applied to the plates. In some embodiments, the applied voltage is an AC voltage. Alternatively, the applied voltage can be a DC voltage. Additionally, the electric field can demonstrate a singular orientation or variable orientation during vibration and/or solvent evaporation of the deposited solution.

Moreover, a method of making an organic thin film transistor described herein further comprises providing a gate terminal. A gate terminal, in some embodiments, is provided on a side of the dielectric substrate opposing the source and drain terminals. In other embodiments, a gate terminal is provided over the organic film, wherein a gate dielectric is provided between the organic film and gate terminal. Additionally, in some embodiments, a method of making an organic thin film transistor described herein further comprises positioning a work function alteration layer between the organic thin film and at least one of the source terminal and drain terminal.

In another aspect, methods of making photovoltaic devices are described herein. A method of making a photovoltaic device comprises providing a first electrode and drop-casting a photosensitive organic film over the first electrode from a solution of donor small molecule, wherein the deposited solution is vibrated during evaporation of solution solvent. The deposited solution, in some embodiments, comprises a nanoparticle acceptor phase operable to form bulk heterojunctions with the donor small molecule in the photosensitive organic film. Further, the deposited solution can be vibrated at a frequency ranging from about 1 Hz to about 5000 Hz. Solvent of the deposited solution, in some embodiments, is evaporated at a rate ranging from 5 μL/hr to 50 μL/hr. A second electrode is deposited over the photosensitive organic film.

These and other embodiments are described in greater detail in the detailed description which follows.

BRIEF DESCRIPTION OF THE DRAWINGS

FIG. 3 illustrates an organic thin film transistor according to one embodiment described herein.

FIG. 4 illustrates an organic thin film transistor according to one embodiment described herein.

DETAILED DESCRIPTION

Figure 1:
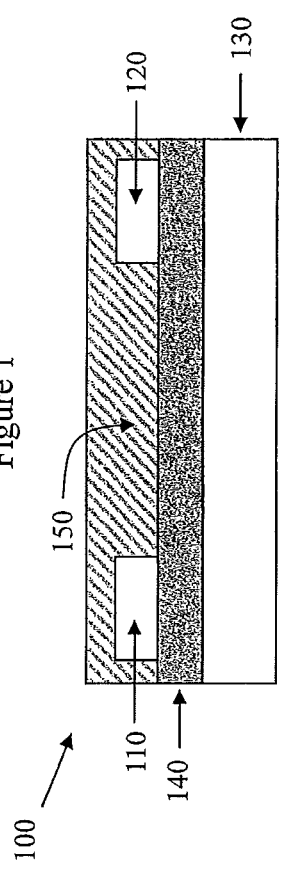
FIG. 1 illustrates an organic thin film transistor according to one embodiment described herein.

Embodiments described herein can be understood more readily by reference to the following detailed description, example, and drawings. Elements, apparatus, and methods described herein, however, are not limited to the specific embodiments presented in the detailed description, example, and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

I. Organic Thin Film Transistors

In some embodiments, an organic thin film transistor described herein comprises a source terminal, a drain terminal, a gate terminal and a dielectric layer positioned between the gate terminal and the source and drain terminals. A vibrationally-assisted drop-cast organic film comprising small molecule semiconductor is in electrical communication with the source terminal and drain terminal. In some embodiments, the transistor has a $\mu_{eff}$ according to Table I

TABLE I

| TFT $\mu_{eff}$ |
| --- |
| $\mu_{eff}$ (cm$^2$/V · s) |
| ≥1 |
| ≥2 |
| ≥3 |
| 1-5 |
| 2-4 |
| 3-5 |

$\mu_{eff}$ can be determined according to equation (1):

$$I_D = (WC_i/2L) \times \mu_{eff} \times (V_{GS} - V_T)^2 \qquad (1),$$

wherein $I_D$ is the drain current, W is the channel width, L is the channel length, $C_i$ is the dielectric capacitance per unit area, $V_{GS}$ is the gate voltage, and $V_T$ is the threshold voltage. The channel length of a transistor described herein, in some embodiments, ranges from about 5 μm to about 100 μm. The channel width, in some embodiments, ranges from about 10 μm to about 5 mm or from about 100 μm to about 1 mm.

Additionally, in some embodiments, an organic thin film transistor described herein has a threshold voltage ($V_T$) ranging from about −3V to 3V. In some embodiments, an organic thin film transistor has a $V_T$ ranging from about −1V to 1V or from about 0.1V to 1V.

Moreover, in some embodiments, a transistor described herein has a subthreshold swing (S) of less than about 1 V/dec. In some embodiments, S is less than about 0.5 V/dec. In some embodiments, a transistor described herein has a subthreshold swing ranging from about 0.4 V/dec to 1.0 V/dec. Subthreshold swing can be calculated by finding the inverse of the slope of the linear fit line of the plot of log($I_D$) versus $V_{GS}$ in the saturation regime. Subthreshold swing can also be calculated according to equation (2):

$$S = (kT/q) \times \ln 10 \times n \qquad (2),$$

wherein k is the Boltzmann constant (1.38×10$^{-23}$ J/K), T is the temperature in Kelvin (e.g., 298 K), q is the elementary charge (1.60×10$^{-19}$ C), and n is the ideality factor, n=1+ (qN$_{it}$/c$_i$).

Further, a transistor described herein can have a N$_{it}$ of less than 1E$^{12}$ cm$^2$-eV$^{-1}$ or less than 1E$^{11}$ cm$^2$-eV$^{-1}$. N$_{it}$ is calculated according to equation (3):

$$N_{it} = \frac{C_i}{q^2} \left( \frac{S_q}{k_B T \ln(10)} - 1 \right) \qquad (3)$$

where q is the elementary charge, $k_B$ is the Boltzman constant, T is the temperature in Kelvin, $C_i$ is the capacitance per unit area of the dielectric and S is the subthreshold swing. In some embodiments, a transistor has a N$_{it}$ according to Table II.

TABLE II

| Interfacial Trap Density (N$_{it}$) |
| --- |
| N$_{it}$ (cm$^{-2}$eV$^{-1}$) |
| <1E$^{12}$ |
| 1-9E$^{11}$ |
| 3-8E$^{11}$ |

TABLE II-continued

Interfacial Trap Density ($N_{it}$)
$N_{it}$ (cm$^{-2}$eV$^{-1}$)

4–7E$^{11}$
5–9E$^{11}$

Values listed in Table II can be applicable to various constructions of dielectric and vibrationally-assisted drop-cast organic film of small molecule semiconductor. For example, values of Table II can be applicable to $SiO_2$ dielectric and acene-based small molecule semiconductor.

In some embodiments, an organic thin film transistor described herein further comprises a work function alteration layer positioned between at least one of the source terminal and drain terminal and the organic film. In some embodiments, a work function alteration layer is positioned between both the source terminal and the organic film and the drain terminal and the organic film.

An organic thin film transistor described herein can have any structure not inconsistent with the objectives of the present invention. In some embodiments, for example, the source and drain terminals of an organic thin film transistor are adjacent to the dielectric layer. Further, in some embodiments, the organic film is positioned between the source and drain terminals and the dielectric layer.

FIG. 1 illustrates the structure of an organic thin film transistor according to one embodiment described herein. Organic thin film transistor (100) comprises a source terminal (110), a drain terminal (120), and a gate terminal (130). A dielectric layer (140) is positioned between the gate terminal (130) and the source and drain terminals (110, 120). A vibrationally-assisted drop-cast organic film (150) is in electrical communication with the source terminal (110) and drain terminal (120). If desired, a work function alteration layer (not shown) can be positioned between the source terminal (110) and the organic film (150) and between the drain terminal (120) and the organic film (150). For example, in some embodiments, a work function alteration layer comprises a self-assembled monolayer (SAM) positioned on one or more surfaces of the source terminal, drain terminal, or both.

Figure 2:
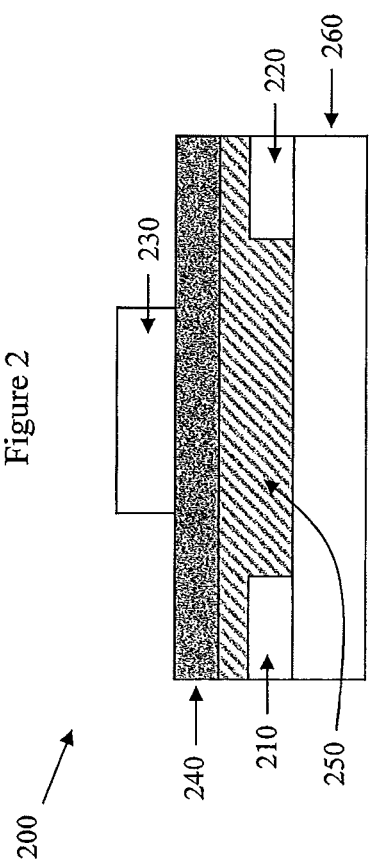
FIG. 2 illustrates an organic thin film transistor according to one embodiment described herein.

FIG. 2 illustrates an alternative structure of an organic thin film transistor according to another embodiment described herein. Organic thin film transistor (200) comprises a source terminal (210), a drain terminal (220), and a gate terminal (230). A dielectric layer (240) is positioned between the gate terminal (230) and the source and drain terminals (210, 220). A vibrationally-assisted drop cast organic film (250) is in electrical communication with the source terminal (210) and the drain terminal (220). The organic film (250) is positioned between the source and drain terminals (210, 220) and the dielectric layer (240). If desired, a work function alteration layer (not shown) can be positioned between the source terminal (210) and the organic film (250) and/or between the drain terminal (220) and the organic film (250). In the embodiment of FIG. 2, organic film transistor (200) further comprises an insulating substrate (260) adjacent to the source and drain terminals (210, 220). Any insulating substrate not inconsistent with the objectives of the present invention may be used. In some embodiments, insulating substrate (260) comprises glass such as $SiO_2$.

The various components of an organic thin film transistor described herein are not necessarily limited to the structures of FIGS. 1 and 2. Other device structures not inconsistent with the objectives of the present invention may also be used. FIG. 3 illustrates another structure of an organic thin film transistor according to one embodiment described herein. Organic thin film transistor (300) comprises source (310) and drain (320) terminals over and in electrical communication with a vibrationally-assisted drop cast organic film (350). A dielectric layer (340) is positioned between the organic film (350) and gate terminal (330). If desired, a work function alteration layer (not shown) can be positioned between the source terminal (310) and the organic film (350) and/or between the drain terminal (320) and the organic film (350).

FIG. 4 illustrates another structure of an organic thin film transistor according to one embodiment described herein. Organic thin film transistor (400) comprises source (410) and drain (420) terminals over and in electrical communication with a vibrationally-assisted drop cast organic film (450). A dielectric layer (440) is positioned between the gate terminal (430) and source and drain terminals (410, 420). If desired, a work function alteration layer (not shown) can be positioned between the source terminal (410) and the organic film (450) and/or between the drain terminal (420) and the organic film (450).

In addition, the various components of an organic thin film transistor described herein can, in some embodiments, be selected independently of device structure. Moreover, the various components can be selected and combined with one another in any manner not inconsistent with the objectives of the present invention.

Turning now to components of organic thin film transistors, organic thin film transistors described herein comprise a source terminal and a drain terminal. The source and drain terminal can comprise any material suitable for a source and drain. In some embodiments, for instance, a source or drain terminal is metal. A metal terminal, in some embodiments, is a pure metal or a metal alloy. In some embodiments, for example, the source and/or drain terminals are gold, silver, copper, titanium or aluminum or a combination thereof. Source and drain terminals can also have any physical dimensions not inconsistent with the objectives of the present invention. In some embodiments, for example, a source and/or drain terminal has a thickness of about 10 nm to about 200 nm. In some embodiments, a source and/or drain terminal has a thickness of about 20 nm to about 150 nm, or about 30 nm to about 100 nm. In some embodiments, a source and/or drain terminal has a thickness greater than about 200 nm. Moreover, in some embodiments, one or more dimensions of a source and/or drain terminal can be selected to achieve a desired channel length or width in the organic film.

Organic thin film transistors described herein also comprise a gate terminal. A gate terminal can comprise any material suitable for serving as a gate terminal. In some embodiments, for instance, a gate terminal comprises a semiconductor. A semiconductor gate terminal, in some embodiments, comprises a doped semiconductor such as doped silicon. A doped semiconductor, in some embodiments, can be n-type or p-type. In some embodiments, a gate terminal is metal. A metal terminal, in some embodiments, is a pure metal or a metal alloy. In some embodiments, a metal terminal is gold, silver, copper, or aluminum. A gate terminal can also have any physical dimensions not inconsistent with the objectives of the present invention. In some embodiments, for example, a gate terminal has a thickness of about 500 µm to about 1 mm.

In some embodiments, an organic thin film transistor described herein further comprises a work function alteration layer positioned between the vibrationally-assisted drop-cast organic film and at least one of the source terminal and drain terminal and the organic film. Any work function alteration layer not inconsistent with the objectives of the present invention may be used. A work function alteration layer, in some embodiments, is operable to alter the work function or charge injection of a source and/or drain terminal. In some embodiments, for example, a work function alteration layer assists in reconciling the electronic structure of the source or drain terminal with the vibrationally-assisted drop-cast organic layer, thereby improving charge injection.

In some embodiments, a work function alteration layer comprises a self-assembled monolayer (SAM) formed between a terminal and the organic film. Moreover, in some embodiments, a SAM can comprise a small molecule monolayer. In some embodiments, a work function alteration layer comprises a self-assembled monolayer of a fluorinated compound. In some embodiments, the fluorinated compound is a fluorinated thiol, such as pentafluorobenzenethiol. Use of a work function alteration layer described herein, in some embodiments, enhances the carrier mobility of the transistor. For example, in some embodiments, $\mu_{eff}$ of an organic thin film transistor described herein comprising a work function alteration layer is at least about 2 cm²/V·s or at least about 3 cm²/V·s.

An organic thin film transistor described herein also comprises a dielectric layer positioned between the gate terminal and the source and drain terminals. Any dielectric layer not inconsistent with the objectives of the present invention may be used. In some embodiments, for example, a dielectric layer is formed from an organic material, such as a dielectric organic polymer. In other embodiments, a dielectric layer is formed from an inorganic material. In some embodiments, an inorganic material comprises an inorganic oxide such as alumina or silica. In some embodiments, a dielectric layer is formed from an oxidized semiconductor substrate, such as an oxidized, highly doped silicon substrate. The oxidation, in some embodiments, comprises surface oxidation. In some embodiments, a dielectric layer comprises $SiO_2$. Further, a dielectric layer can have any thickness not inconsistent with the objectives of the present invention. In some embodiments, for example, a dielectric layer has a thickness of about 50 nm to about 50 µm. Moreover, a dielectric layer described herein, in some embodiments, comprises an oxide having a thickness of about 50 nm to about 1 mm.

In some embodiments, an organic thin film transistor described herein further comprises a surface energy alteration layer positioned between the vibrationally-assisted drop-cast organic film and one or more dielectric layers of the transistor. With reference to FIG. 1, a surface energy alteration layer can be positioned between the vibrationally-assisted drop-cast organic film (150) and dielectric layer (140). Alternatively, with reference to FIG. 2, a surface energy alteration layer, in some embodiments, is positioned between the insulating or dielectric substrate (260) and vibrationally-assisted drop-cast organic film (250). Surface energy alteration layers can also be positioned between vibrationally-assisted drop-cast organic films and dielectric layers of the transistors of FIGS. 3 and 4.

A surface energy alteration layer, in some embodiments, lowers the surface energy of the dielectric layer. For example, a surface energy alteration layer can comprise one or more species operable to increase the hydrophobic character of the dielectric surface. In some embodiments, for example, a surface energy alteration layer comprises organic silanes including, but not limited to, organic trichlorosilanes and hexamethyldisilazane (HMDS). Organic trichlorosilanes can comprise octadecyltrichlorosilane (OTS), 7-octenyltricholosilane (VTS), (tridecafluoro-1,1,2,2-tetrahydrooctyl)trichlorosilane (FTS) or benzyltrichlorosilane (BTS). Chemical species of the surface energy alteration layer, in some embodiments, form self-assembled monolayers.

As described herein, the organic thin film transistor also comprises a vibrationally-assisted drop-cast organic film comprising small molecule semiconductor. A vibrationally-assisted drop-cast organic film can exhibit one or more structural properties that differentiate other organic films, including other drop-cast organic films, spin-coated organic films and/or spray-coat organic thin films. For example, in some embodiments, a vibrationally-assisted drop-cast organic film described herein comprises a polycrystalline film of small molecule semiconductor having increased grain sizes compared to other drop-cast, spin-coat and/or spray coat organic thin films. In some embodiments, crystalline grains of a vibrationally-assisted drop-cast organic film have an average size in at least one dimension greater than 30 µm or 50 µm. In some embodiments, the crystalline grains have an average size in at least one dimension between 30 µm and 200 µm or between 30 µm and 100 µm. In some embodiments, the crystalline grains have an average size in at least one dimension between 50 µm and 100 µm or between 70 µm and 90 µm. Additionally, a vibrationally-assisted drop-cast organic film can demonstrate a smaller number of grain boundaries per area than other organic thin films. Further, vibrationally-assisted drop-cast organic films can benefit from improved intra-grain molecular order, leading to reductions in trap density and enhanced carrier mobilities.

Any small molecule semiconductor not inconsistent with the objectives of the present invention may be used in an vibrationally-assisted drop-cast organic film described herein. For example, in some embodiments, a small molecule semiconductor comprises one or more acenes. An acene, in some embodiments, comprises a substituted or unsubstituted naphthalene, anthracene, tetracene, pentacene, hexacene, or heptacene. In some embodiments, a small molecule semiconductor is of Formula (I):

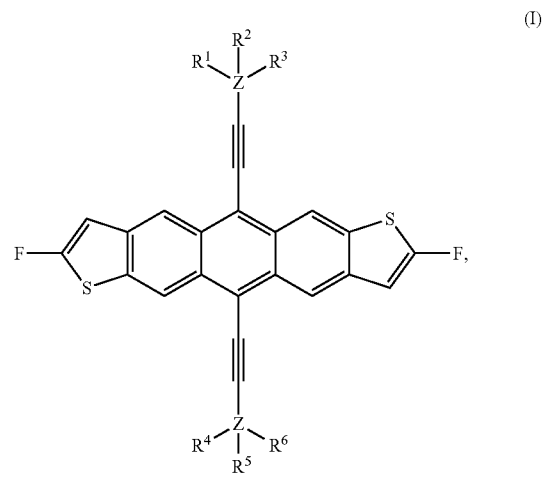

wherein Z is selected from the group consisting of Si and Ge and $R^1$-$R^6$ are independently selected from the group consisting of $C_{1-20}$ alkyl and $C_{1-20}$ alkenyl. For example, in some embodiments, the small molecule semiconductor is 2,8-difluoro-5,11-bis(triethylsilylethynyl)anthradithiophene [diF-TES-ADT]. In some embodiments, the small molecule semiconductor is 2,8-difluoro-5,11-bis(triisopropylsilylethynyl) anthradithiophene [diF-TIPS-ADT] or triethylgermylethynyl-substituted anthradithiophene [diF-TEG ADT]. The small molecule semiconductor can also be 2,8-difluoro-5,11-bis(tri-sec-butylsilylethynyl)difluoro anthradithiophene. Further, the small molecule semiconductor can be of Formula (I), wherein the fluorines of the thiophenes are removed. In such embodiments, for example, the small molecule semiconductor can be [TES-ADT]. Additionally, the small molecule semiconductor can be of Formula (I), wherein the fluorines of the thiophenes are replaced with cyano functionalities producing CN-TES-ADT.

In some embodiments, a small molecule semiconductor is of Formula II:

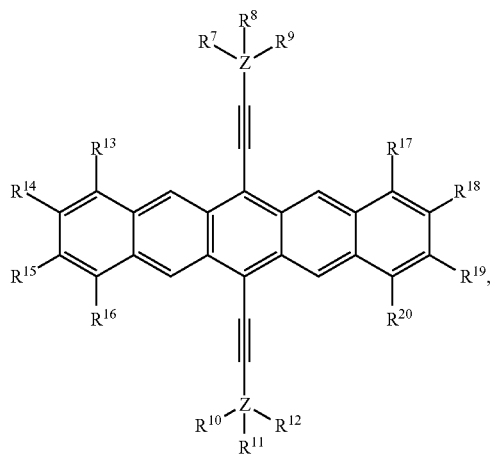

(II)

wherein Z is selected from the group consisting of Si and Ge and $R^7$-$R^{12}$ are independently selected from the group consisting of $C_{1-20}$ alkyl and $C_{1-20}$ alkenyl and $R^{13}$-$R^{20}$ are independently selected from the group consisting of hydrogen, halogen, cyano, alkyl, alklenyl, alkynyl, aryl and heteroaryl. In some embodiments, the small molecule is 6,13-bis(triisopropylsilylethynyl)pentacene or 1,2,3,4-tetrafluoro-5,11-bis(triisopropylsilylethynyl)pentacene [F4 TIPS Pn]. Similarly, the small molecule can be F2 TIPS Pn or F8 TIPS Pn.

In some embodiments, a small molecule semiconductor is of Formula III:

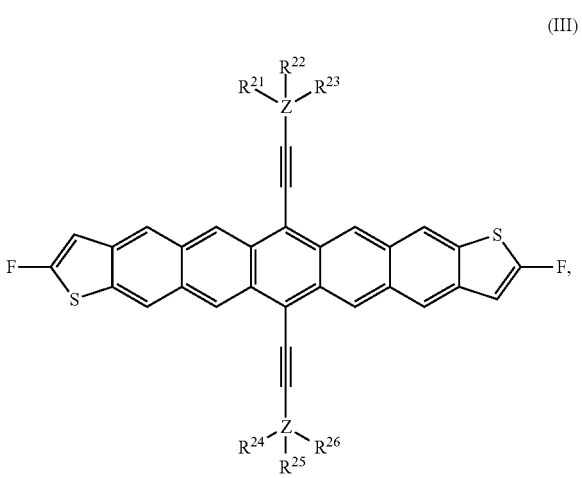

(III)

wherein Z is selected from the group consisting of Si and Ge and $R^{21}$-$R^{26}$ are independently selected from the group consisting of $C_{1-20}$ alkyl and $C_{1-20}$ alkenyl. For example, the small molecule can be 2,8-difluoro-5,11-bis(tri-sec-butylsilylethynyl) pentacenedithiophene.

Further, a small molecule semiconductor can be of Formula IV:

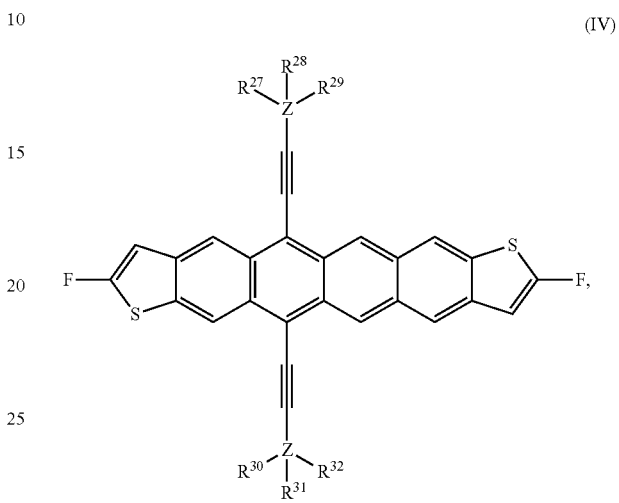

(IV)

wherein Z is selected from the group consisting of Si and Ge and $R^{27}$-$R^{32}$ are independently selected from the group consisting of $C_{1-20}$ alkyl and $C_{1-20}$ alkenyl. For example, the small molecule can be 2,8-difluoro-5,11-bis(tri-sec-butylsilylethynyl) tetracenedithiophene.

Additionally, a small molecule semiconductor can be selected from Table III.

TABLE III

Small Molecule Semiconductor of Vibrationally-Assisted Drop-Cast Organic Film 2,7-alkyl[1]benzothieno[3,2-b][1]benzothiophene (C8-BTBT)
2,9-alkyl-dinaphtho[2,3-b:2',3'-f]thieno[3,2-b]thiophene (C 10-DNTT)
N,N-1H,1H-perfluorobutyldicyanoperylene-carboxydiimide (PDIF-$CN_2$)
Sexithiophene (6T)
poly[9,9'dioctyl-fluorene-co-bithiophene] (F8T2)
polytriarylamine (PTAA)
poly-2,5-thienylene vinylene (PVT)
α,ω-dihexylquinquethiophene (DH-5T)
α,ω-dihexylsexithiophene (DH-6T)
perfluorocopperphthalocyanine (FPcCu)
3',4'-dibutyl-5,5''-bis(dicyanomethylene)-5,5''-dihydro-2,2':5',-2''-terthiophene (QM3T)
α,ω-diperfluorohexyloligothiophene (DFH-nT)
2,7-[bis(5-perfluorohexylcarbonylthien-2-yl)]-4H-cyclopenta-[2,1-b:3,4-b']-dithiophen-4-one (DFHCO-4TCO)
Poly[bisbenzimidazobenzophenanthroline] (BBB)
α,ω-diperfluorophenylquaterthiophene (FTTTTF)
dicyanoperylene-bis[dicarboximide] (DPI-CN)
naphthalene tetracarboxylic diimide (NTCDI)
Tetracene
Anthracene
Tetrathiafulvalene (TTF)
Poly(3-alkythiophene)
Dithiotetrathiafulvalene (DT-TTF)
Cyclohexylquaterthiophene (CH4T)

In addition, in some embodiments, the organic film of an organic thin film transistor described herein does not comprise a polymeric material, such as an organic polymer semiconductor. In other embodiments, the organic film of a transistor described herein does comprise a polymeric material in addition to the small molecule semiconductor.

II. Methods of Making an Organic Thin Film Transistor

In another aspect, methods of making organic thin film transistors are described herein which, in some embodiments, can provide one or more advantages over prior methods. Methods described herein, in some embodiments, are operable to produce desirable morphologies in the organic thin film at low temperatures, including room temperature, and/or preclude post deposition processing, such as organic thin film annealing. Therefore, in some embodiments, highly ordered crystalline materials can be obtained simply and inexpensively. Moreover, in some embodiments, methods described herein can be used with a wide range of substrate materials and sizes, thereby permitting versatile, scalable and/or high throughput production of thin film transistors.

In some embodiments, a method of making an organic thin film transistor comprises providing a source terminal and a drain terminal on a dielectric substrate and drop-casting an organic film on surfaces of the source and drain terminals from a solution of small molecule semiconductor, wherein the deposited solution is vibrated during evaporation of solution solvent. The method further comprises providing a gate terminal. Additionally, in some embodiments, a method of making an organic thin film transistor described herein further comprises positioning a work function alteration layer between the vibrationally-assisted drop-cast organic film and at least one of the source terminal and drain terminal. In some embodiments, a work function alteration layer is positioned between both the source terminal and the organic layer and the drain terminal and the organic layer.

Turning now to steps of methods, a method of making an organic thin film transistor described herein comprises providing a source terminal and a drain terminal on a dielectric substrate. The source and drain terminals can be provided in any manner not inconsistent with the objectives of the present invention. In some embodiments, integrated circuit manufacturing techniques can be used to provide the source and drain terminals. For example, in some embodiments, a source and/or drain terminal is provided by one or more photolithographic techniques, including masking, vapor deposition, e-beam deposition or sputtering and mask removal. Source and drain terminals as well as dielectric substrates of methods herein can have any composition and/or properties described in Section I above for such elements of the organic thin film transistor.

A method of making a transistor described herein also comprises drop-casting an organic film on surfaces of the source and drain terminals from a solution of small molecule semiconductor. The amount of small molecule semiconductor in the drop-casting solution, in some embodiments, ranges about 0.05 weight percent and about 2 weight percent. In some embodiments, the amount of small molecule semiconductor in the solution ranges from about 0.1 weight percent to about 1 weight percent or from about 0.2 weight percent to about 0.8 weight percent. In some embodiments, the amount of small molecule semiconductor in the solution ranges from about 0.4 weight percent to about 0.6 weight percent. Moreover, in some embodiments, the amount of small molecule semiconductor in the solution is at least about 0.5 weight percent. Any solvent not inconsistent with the objectives of the present invention may be used. In some embodiments, the solvent comprises an organic solvent such as chlorobenzene. Moreover, a solvent can be selected based on one or more of its ability to dissolve a small molecule semiconductor, its boiling point and/or its vapor pressure.

In methods described herein, the deposited solution is vibrated during evaporation of solution solvent. In some embodiments, the deposited solution is vibrated at a frequency ranging from about 1 Hz to about 5000 Hz or from about 10 Hz to about 1000 Hz. In some embodiments, the deposited solution is vibrated at a frequency ranging from about 100 Hz to about 500 Hz or from about 1 Hz to 200 Hz. Moreover, in some embodiments, vibrations are provided in a lateral plane of the deposited solution. For reference purposes herein, a lateral plane of the deposited solution can be parallel or substantially parallel to a substrate onto which the solution is drop-cast, such as a dielectric substrate and/or terminal contacts. In some embodiments, vibrations are provided outside of a lateral plane of the solution. For example, in some embodiments, vibrations are provided in a plane normal to the lateral plane of the deposited solution. Moreover, vibrations can be provided in any plane forming an angle with the lateral plane between 0 and 90 degrees. In some embodiments, vibrations are constrained to one axis.

Moreover, vibrations described herein can also have any amplitude not inconsistent with the objectives of the present invention. In some embodiments, a desired crystallization and/or order in the drop-cast organic film can be vibrationally-assisted by altering one or more of the amplitude, frequency, and direction of vibration. In addition, in some embodiments, the amplitude, frequency, and/or direction of vibration are selected based on the identity of the materials used in the device.

Vibrations can be provided using any apparatus suited for producing vibration in the desired plane(s) and of the desired frequency and/or amplitude, including apparatus described in the Example hereinbelow. Further, in some embodiments, the dielectric substrate is also vibrated during evaporation of the solution solvent, including in a manner described herein for vibration of the solution.

Figure 5:
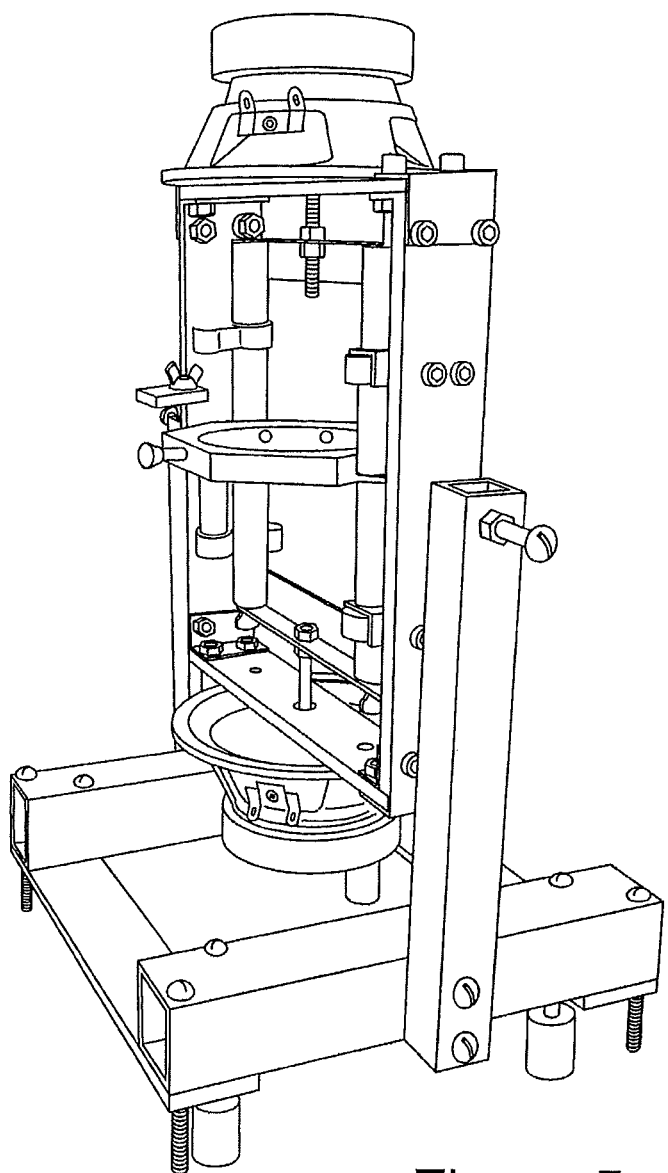
FIG. 5 illustrates an organic thin film deposition apparatus according to one embodiment described herein.

In some embodiments, an apparatus suited for producing desired vibrations comprises a sample holder and two audio speakers (5.25 inch diameter and 5-ohms each) oriented in opposition to one another with the sample holder there between. In each speaker cone, a nylon plug can be present permitting the cone to push against the plug and transfer motion to the sample holder. The speakers can be wired to be out of phase allowing one speaker to push while the remaining speaker pulls producing a combined action that vibrates the substrate. The sample holder is held in place by Teflon guides that allowed motion only in the output axis of the speakers. FIG. 5 illustrates the organic thin-film deposition apparatus of comprising the two-audio speakers according to one embodiment.

The amplitude and frequency of vibration can be controlled with computer software and provided a square waveform with a 50% duty cycle. Vibrational control with computer software permits other waveforms to be generated, such as saw-toothed, and frequency sweeps at user-defined intervals and steps. Further, the balance of the speakers can be adjusted to ensure both are driven with comparable and repeatable power.

In some embodiments, an electric field can be applied to the deposited solution during vibration of the solution and/or evaporation of the solution solvent. For example, electrically conductive plates can be arranged in a manner to place the deposited solution in an electrical field when a voltage is applied to the plates. In some embodiments, the applied voltage is an AC voltage. Alternatively, the applied voltage can be a DC voltage. Additionally, the electric field can demonstrate a singular orientation or variable orientation during vibration and/or solvent evaporation of the deposited solution. Electric field orientation can be varied by altering the position of the electrically conductive plates and/or apparatus containing the dielectric substrate and deposited solution. In some embodiments, the electric field is applied only during vibration of the deposited solution. In other embodiments, the electric field is applied prior and/or subsequent to vibration of the deposited solution. Further, in some embodiments, the electric field is applied prior and/or during and/or subsequent to vibration of the deposited solution. Additionally, in some embodiments, an electric field is applied to the deposited solution, wherein vibration is not applied thereby producing an electric field-assisted drop-cast organic film comprising small molecule semiconductor.

Evaporation of the solvent of the deposited solution can take place at any rate not inconsistent with the objectives of the present invention. In some embodiments, solvent is evaporated at a rate ranging from about 5 µL/hr to 50 µL/hr. In some embodiments, solvent is evaporated at a rate ranging from about 10 µL/hr to 40 µL/hr. In addition, the rate of solvent evaporation can be controlled. In some embodiments, for example, the evaporation rate can be controlled by one or more of choice of solvent system (including identity and amount of solvent), temperature, pressure, and use of a closed or open environment, where a closed or partially closed environment can be used to trap solvent vapor, leading to longer evaporation times. For example, in some embodiments, evaporation rate is controlled by covering the drop-cast solution and substrate. Further, in some embodiments, excess solvent can be placed in a container with the substrate and deposited solution of small molecule semiconductor, wherein the excess solvent is spatially discrete from and does not interact with the deposited solution. In one embodiment, for example, excess solvent can be placed in a separate chamber of the container, the separate chamber sharing a common overhead space with the substrate and solution of semiconductor small molecule deposited thereon.

A method of making an organic thin film transistor described herein further comprises providing a gate terminal. A gate terminal, in some embodiments, is provided on a side of the dielectric substrate opposing the source and drain terminals. In other embodiments, a gate terminal is provided over the organic film, and a gate dielectric is provided between the organic film and gate terminal. The gate terminal and gate dielectric can comprise any gate terminal and dielectric not inconsistent with the objectives of the present invention, including a gate terminal or dielectric described hereinabove in Section I.

A method described herein, in some embodiments, further comprises positioning a work function alteration layer between the vibrationally-assisted drop-cast organic film and at least one of the source terminal or drain terminal. In some embodiments, the work function alteration layer is positioned between the source terminal and the organic film and the drain terminal and the organic film. Further, the work function alteration layer can be positioned in any manner not inconsistent with the objectives of the present invention. In some embodiments, for instance, positioning a work function alteration layer comprises forming a SAM on one or more surfaces of the source terminal, drain terminal, and/or organic film.

The organic film of a method described herein can comprise any organic film described hereinabove in Section I. For example, in some embodiments, an organic film comprises a small molecule semiconductor. In some embodiments, an organic film comprises crystalline grains of the small molecule semiconductor. The crystalline grains, in some embodiments, have an average size in at least one dimension greater than 30 µm or greater than 50 µm. In some embodiments, the crystalline grains have an average size in at least one dimension between 30 µm and 200 µm or between 40 µm and 100 µm. In addition, in some embodiments, a small molecule semiconductor comprises one or more acenes or heteroacenes. An acene, in some embodiments, comprises a substituted or unsubstituted naphthalene, anthracene, tetracene, pentacene, hexacene, or heptacene. In some embodiments, a small molecule semiconductor can be any one of Formulas I-IV herein. For example, in some embodiments, the small molecule semiconductor is selected from the species of Table IV.

TABLE IV

| Small Molecule Semiconductor |
|---|
| diF-TES-ADT |
| diF-TIPS-ADT |
| diF-TEG ADT |
| TES-ADT |
| TIPS Pn |
| F2 TIPS Pn |
| F4 TIPS Pn |
| F8 TIPS Pn |
| 2,8-difluoro-5,11-bis(tri-sec-butylsilylethynyl)pentacenedithiophene |
| 2,8-difluoro-5,11-bis(tri-sec-butylsilylethynyl)tetracenedithiophene |

Further, in some embodiments, the organic film of an organic thin film transistor made by a method described herein does not comprise a polymeric material, such as an organic polymer semiconductor. In other embodiments, an organic film does comprise a polymeric material in addition to a small molecule semiconductor.

Moreover, an organic thin film transistor made by a method described herein can have any structure and exhibit any properties of a transistor described hereinabove in Section I. In some embodiments, for instance, an organic thin film transistor has the structure of the embodiment of FIG. 1. In other embodiments, an organic thin film transistor made by a method described herein has the structure of the embodiment of FIG. 2. Further, in some embodiments, an organic thin film transistor made by a method described herein exhibits a high carrier mobility, a low threshold voltage, and a low subthreshold swing, as described hereinabove in Section I.

III. Methods of Making a Photovoltaic Device

In another aspect, methods of making photovoltaic devices are described herein. A method of making a photovoltaic device comprises providing a first electrode and drop-casting a photosensitive organic film over the first electrode from a solution of donor small molecule, wherein the deposited solution is vibrated during evaporation of solution solvent. Further, a second electrode is deposited over the photosensitive organic film.

First and second electrodes of the photovoltaic device can be fabricated from any material not inconsistent with the objectives of the present invention. First and second electrodes, for example, can be formed of metal, such as aluminum, nickel, copper, gold, silver, platinum, palladium or other transition metals or alloys thereof. When constructed of a metal or alloy, the first and/or second electrode can be reflective or otherwise non-radiation transmissive. However, in some embodiments, a metal electrode can be of thickness permitting the transmission of radiation.

Alternatively, the first and/or second electrode can be constructed of one or more materials that are radiation transmissive. Radiation transmissive materials can pass visible electromagnetic radiation without substantial interference or attenuation. Suitable radiation transmissive materials can comprise one or more radiation transmissive conducting oxides. Radiation transmissive conducting oxides can include one or more of indium tin oxide (ITO), gallium indium tin oxide (GITO), aluminum tin oxide (ATO) and zinc indium tin oxide (ZITO). In some embodiments, a radiation transmissive first and/or second electrode is formed of a polymeric material such as polyanaline (PANT) and its chemical relatives or 3,4-polyethylenedioxythiophene (PEDOT). Further, a radiation transmissive first and/or second electrode can be formed of a carbon nanotube layer having a thickness operable to at least partially pass visible electromagnetic radiation. An additional radiation transmissive material can comprise a nanoparticle phase dispersed in a polymeric phase.

The first electrode and second electrode can demonstrate the same or different constructions. Also, first and second electrodes can have any thickness not inconsistent with the objectives of the present invention. In some embodiments, first and second electrodes have a thickness ranging from 10 nm to 100 μm.

As described herein, a photosensitive organic film is drop-cast over the first electrode from a solution of donor small molecule, wherein the deposited solution is vibrated during evaporation of solution solvent. Any photosensitive donor small molecule not inconsistent with the objectives of fabricating a photovoltaic apparatus can be employed in the solution. For example, donor small molecule can be an acene of one of Formulas (I)-(IV) described in Section I herein, including TIPS-pentacene, 8F-TIPS-pentacene and $CN_4$-TIPS pentacene. Donor small molecule can also comprise one or more acene-dithiophenes such as TES-ADT, ethyl-TES-ADT, diF-TES-ADT and diCN-TES-ADT. Additional suitable thiophenes can include various oligothiophenes, such as X-shaped oligothiophene (X-OT), and 5,5'-bis {(4-(7-hexylthiophen-2-yl)thiophen-2-yl)-[1,2,5] thiadiazolo[3,4-c]pyridine}-3,3'-di-2-ethylhexylsilylene-2,2'-bithiophene [DTS(PTTh$_2$)$_2$]. Further, donor small molecule can comprise triphenylamine derivatives such as those containing conjugated oligothienylenevinylene groups. In some embodiments, donor small molecule of the drop-cast solution is selected from Table V.

TABLE V

| Donor Small Molecule |
| --- |
| N,N'-bis(2,5-di-tert-butylphenyl)3,4,9,10-perylenedicarboxamide (PDCDT) |
| N,N'-dipentyl-3,4,9,10-perylenedicarboxamide (PenPTC) |
| Zinc phthalocyanine (ZnPC) |
| Copper phthalocyanine (CuPC) |
| Titanium oxide phthalocyanine (TiOPC) |
| Bisbenzimidazo[2,1-a:1',2-b]anthrax[2,1,9-def:6,5,10-d'e'f']diisoguinoline-10,21-dione, with cis-isomer (PTCBI) |
| Anthra[2",1"9";4,5,6,6",5",10";4',5',6']diisoquino[2,1-a; 2',1'-a]diperimidine-12,25-dione, with cis-isomer (ADID) |
| 3,4,9,10-perylenetetracarboxylic dianhydride (PTCDA) |
| 3,4,9,10-perylenetetracarboxylic acid diimide (PTCDI) |
| 1,1-bis-(4-bis(4-methyl-phenyl)-amino-phenyl)-cyclohexane (TAPC) |
| Diketopyrrolo-pyrrole derivatives (DPP-TPA, DPP-BDT, DPP-C1-Pyrene, DPP-C2-Pyrene) |
| 1,4,5,8-naphthalenetetracarboxylic dianhydride (NTDA) |
| N,N'-dimethyl-3,4,9,10-perylene dicarboximide (MePTC) |
| N,N'-diheptyl-3,4,9,10-perylene dicarboximide (HepPTC) |
| Copper(II) 1,2,3,4,8,9,10,11,15,16,17,18,22,23,24,25-hexadecafluoro- |

TABLE V-continued

| Donor Small Molecule |
| --- |
| 29H,31H-phthalocyanine (F$_{16}$CuPC) |
| Boron subphthalocyanine chloride (SubPC) |
| Boron sub-2,3-naphthalocyanine chloride (SubNC) |
| 2,5-di-(2-ethylhexyl)-3,6-bis-(5"-n-hexyl-[2,2',5',2"]terthiophen-5-yl)-pyrrolo[3,4-c]pyrrole-1,4-dione (SMDPPEH) |
| Copper(II) 2,3-naphthalocyanine (CuNC) |
| Copper(II)-2,3,9,10,16,17,23,24-octa-n-hexyl-29H,31H-phthalocyanine (CuPC-8H) |
| Tris(4-(thiophen-2-yl)phenyl)amine (TTPA) |
| Tris(4-(5-phenylthiophen-2-yl)phenyl)amine (TPTPA) |
| 2,5-dihexyl-3,6-bis-(5"-n-hexyl-[2,2',5',2"]terthiophen-5-yl)-pyrrolo[3,4-c]pyrrole-1,4-dione (SMDPPH) |
| 2,5-dioctyl-3,6-bis-(5"-n-hexyl[2,2',5',2"]terthiophen-5-yl)-pyrrolo[3,4-c]pyrrole-1,4-dione (SMDPPO) |
| Dibenzo{[f,f']-4,4',7,7'-tetraphenyl}diindeno[1,2,3-cd:1',2',3'-lm]perylene (DBP) |
| Phthalocyanine, platinum complex (PtPC) |
| Aluminum phthalocyanine chloride (AlPCCl) |
| Diindeno[1,2,3-cd;1',2',3'-lm]perylene (DIP) |
| 3,6-bis(5-(benzofuran-2-yl)thiophen-2-yl)-2,5-bis(2-ethylhexyl)pyrrolo[3,4-c]pyrrole-1,4(2H,5H)-dione (DPP(TBFu)$_2$) |
| Tetrabenzoporphine (BP) |
| 2-((7-(5-(dip-tolylamino)thiophen-2-yl)benzo[c][1,2,5]thiadiazol-4-yl)methylene)malononitrile (DTDCTB) |
| 2-((Z)-2-((E)-2-(1,1-dimethyl-5,6-dihydro-1H-pyrrolo[3,2,1-ij]quinolin-2(4H)-ylidene)ethylidene)-3-oxo-2,3-dihydro-1H-inden-1-ylidene)malononitrile (HB194) |
| 2,2'-(5',5"-(2,2'-bithiophene-5,5'-diyl)bis(3,4'-dibutyl-2,2'-bithiophene-5',5-diyl))bis(methan-1-yl-1-ylidene)dimalononitrile (DCV6T-Bu(1,2,5,6)) |
| Oxyvanadium phthalocyanine (VOPc) |
| 2-(6-(4-(diphenylamino)phenyl)-4,4'-diphenyl-dithieno[3,2-b:2',3'-d]silol-2-yl)-methylene-malononitrile (TPDCDTS) |
| 4,4'-bis(4-(9H-carbazol-9-yl)styryl)biphenyl (BSB4) |
| 2,2'-(5,5'-(thieno[3,2-b]thiophene-2,5-diyl)bis(thiophene-5,2-diyl))bis(methan-1-yl-1-ylidene)dimalononitrile (FT2TDMN) |
| 7,7'-(4,4-bis-(n-octyl)dithieno[3,2-b:2',3'-d]silole-2,6-diyl)dibenzo[c][1,2,5]thiadiazole-4-carbonitrile (BCNDTS) |

The solution of donor small molecule can further comprise a nanoparticle acceptor phase forming bulk heterojunctions with donor small molecule in the vibrationally-assisted drop-cast photosensitive film. Any nanoparticle acceptor phase not inconsistent with the objectives of the present invention can be used. The nanoparticle acceptor phase, for example, can comprise carbon nanoparticles including fullerenes, single-walled carbon nanotubes, multi-walled carbon nanotubes, graphene or mixtures thereof Nanoparticle acceptor phase, in some embodiments, is selected from the species of Table VI.

TABLE VI

| Nanoparticle Acceptor Phase |
| --- |
| Fullerene-C$_{60}$ |
| (6,6)-phenyl-C$_{61}$butyric acid methyl ester (PC$_{61}$BM) |
| (6,6)-phenyl-C$_{71}$butyric acid methyl ester (PC$_{71}$BM) |
| (6,6)-phenyl-C$_{61}$methyl-hexanoate (PC$_{61}$HM) |
| (5,6)-fullerene-C$_{70}$ |
| (6,6)-phenyl-C$_{71}$hexanoic acid methyl ester (PC$_{71}$HM) |

The donor small molecule phase and nanoparticle acceptor phase can be present in any desired ratio. For example, in some embodiments, ratio of donor small molecule to nanoparticle acceptor ranges from 1:10 to 10:1. In other embodiments, ratio of donor small molecule to nanoparticle acceptor ranges from 1:4 to 2:1.

The solution of donor small molecule and nanoparticle acceptor phase, if present, is drop-cast over the first electrode. The solution, in some embodiments, is drop-cast directly on surfaces of the first electrode. Alternatively, the solution of donor small molecule and nanoparticle acceptor phase is deposited on a work function alteration layer as described in Section I hereinabove. A work function alteration layer can assist in reconciling the electronic structure of the first electrode with the vibrationally-assisted drop-cast photosensitive organic layer. Further, the solution of donor small molecule and nanoparticle acceptor phase can be deposited on a charge transfer layer or exciton blocking layer covering the first electrode. In some embodiments, for example, the solution of small molecule and nanoparticle acceptor phase is deposited on a molybdenum oxide ($MoO_x$) layer or PEDOT:PSS layer. An exciton blocking layer can act to confine photogenerated excitons to the region near the dissociating interface and prevent parasitic exciton quenching at the photosensitive organic layer/electrode interface.

The deposited solution of donor small molecule and nanoparticle acceptor phase is vibrated during evaporation of solution solvent. The deposited solution can be vibrated according to the parameters set forth in Section II hereinabove. In some embodiments, for example, the deposited solution is vibrated at a frequency of 1 Hz to 5000 Hz or 1 Hz to 1000 Hz. Further, waveforms and solvent evaporation rates disclosed in Section II herein may also be followed for the deposited solution of donor small molecule and nanoparticle acceptor phase.

The second electrode is deposited over the vibrationally-assisted drop-cast photosensitive organic film. The second electrode can be deposited by a variety of techniques, including thermal evaporation at a pressure of $10^{-6}$ torr. Further, a layer of LiF and/or $Li_2O$ can be deposited between the second electrode and vibrationally-assisted drop-cast photosensitive organic film.

These and other embodiments are further illustrated by the following non-limiting examples.

EXAMPLE 1

Organic Thin Film Transistor

A Vibrationally-assisted organic thin film transistor according to one embodiment described herein was made as follows.

First, a 200-nm thick silicon dioxide layer was grown on the surface of a highly doped silicon substrate by thermal oxidation. The silicon dioxide served as the gate dielectric. Such $Si/SiO_2$ substrates are also commercially available. Before using the substrate to make a device, the substrate was cleaned by rinsing with hot acetone and isopropyl alcohol, followed by exposure to UV radiation and ozone. The substrate was then rinsed in de-ionized water.

Source and drain terminals consisting of 5 nm Ti and 60 nm Au were deposited at the surface of the $SiO_2$ by photolithography and lift-off, permitting precise definition of the channel length (L) and width (W). In this case, the channel length was 50 μm, and the channel width was 1000 μm.

Next, a 30 mM solution of pentafluorobenzenethiol (PFBT, Sigma Aldrich) in ethanol was prepared. The substrate comprising the source and drain terminals was immersed in this PFBT solution for 30 minutes and then sonicated in ethanol for 5 minutes. As a result, a self-assembled monolayer (SAM) of PFBT was formed at the surface of the terminals.

A solution of the small molecule semiconductor was then prepared. Specifically, a 0.5 wt % solution of diF-TES ADT in chlorobenzene was used. A Petri dish was placed in the cone of speaker and leveled. One drop of the diF-TES ADT solution was applied in the center of the Petri dish, and the SAM-treated substrate comprising the source and drain terminals was placed on the drop of diF-TES ADT solution. Six drops (~25 μL each) of the diF-TES ADT solution were placed on the SAM-treated substrate and 250 μL of chlorobenzene were added to the Petri dish around the substrate. The Petri dish was covered with a cover. The Petri dish was strapped to the speaker cone using Tygon tubing to secure the dish cover.

The frequency of a function generator was set to 100 Hz with a square waveform and 50% duty cycle. The amplitude of the function generator or audio amplifier was adjusted so the rms voltage across the speaker terminals (4 ohm, 5 inch) read 45.0 mV. The apparatus was turned on to initiate vibrations, and vibrations were continued for 20 hours. The substrate comprising the deposited organic thin film was removed and placed in a vacuum oven to remove any remaining solvent.

A Comparative organic thin film transistor was also prepared in accordance with the foregoing procedure, the difference being that the diF-TES ADT solution was not subjected to vibration during the drying process.

Figure 6A:
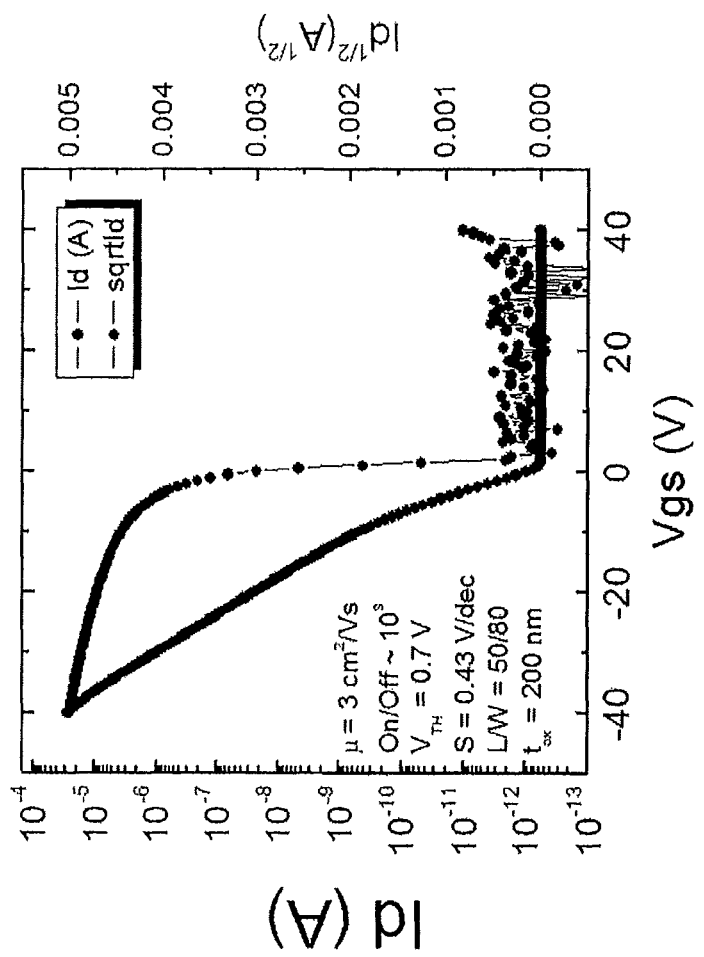
FIG. 6(a) illustrates current-voltage characteristics of an organic thin film transistor according to one embodiment described herein.
Figure 6B:
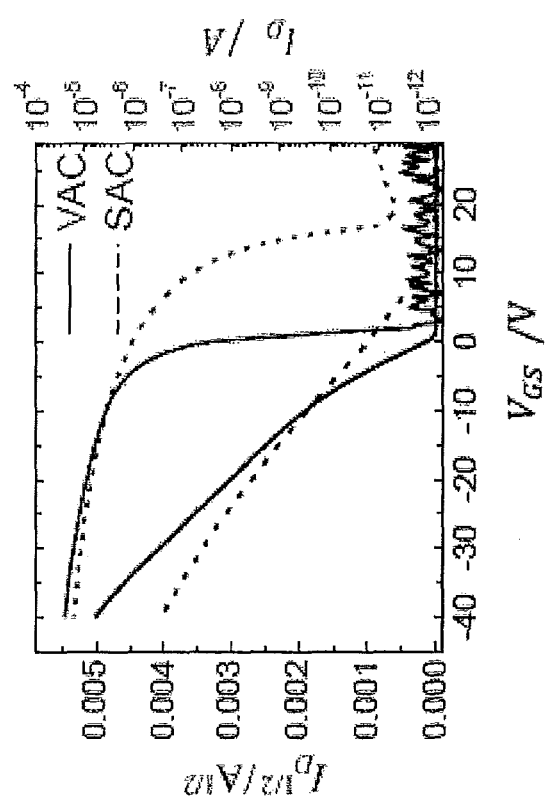
FIG. 6(b) illustrates current-voltage characteristics of a comparative organic thin film transistor relative to the same for FIG. 6(a).

The electrical properties of the Vibrationally-assisted and Comparative organic thin film transistors made as described above were measured using a commercially available probe-station and an Agilent 4155 C semiconductor parameter analyzer. FIG. 6(a) illustrates current-voltage characteristics of the Vibrationally-assisted organic thin film transistor in the saturation regime. The left y-axis (corresponding to the left curve) illustrates $log(I_D)$ versus $V_{GS}$. The right y-axis (corresponding to the right curve) illustrates the square root of $I_D$ versus $V_{GS}$. The device of FIG. 3 exhibited a $\mu_{eff}$ of 3 $cm^2/V\cdot s$, a $V_T$ of 0.7 V, an S of 0.43 V/dec, $N_{it}$ of 6.8E11 $cm^{-2}\cdot eV^{-1}$ and an on/off ratio of about $10^8$. Further, FIG. 6(b) illustrates current-voltage characteristics of the Comparative organic thin film transistor (dashed line) relative to the Vibrationally-assisted organic thin film transistor (solid line). SAC in FIG. 6(b) refers to solvent assisted crystallization of the diF-TES ADT while VAC refers to vibration assisted crystallization of the diF-TES ADT. The Comparative device demonstrated inferior characteristics, including a $\mu_{eff}$ of 0.9 $cm^2/V\cdot s$, a $V_T$ of 11 V, an S of 1.0 V/dec and $N_{it}$ of 1.8E12.

EXAMPLE 2

Organic Thin Film Transistors

Organic thin film transistors employing various vibrationally-assisted drop cast organic thin films were produced in accordance with the procedure of Example 1. Table VII provides the identities of the small molecule semiconductors of the vibrationally-assisted drop cast organic thin films and the resulting current-voltage characteristics of the organic thin film transistors constructed therefrom.

TABLE VII

Organic Thin Film Transistors

| Organic Thin Film Transistor | Small Molecule Semiconductor of Vibrationally-assisted Drop Cast Film | μ ($cm^2/Vs$) | $V_T$ [V] | S [V $dec^{-1}$] |
|---|---|---|---|---|
| 1 | TES-ADT | 0.2 | −7.3 | 1.2 |
| 2 | diF-TIPS ADT | 0.11 | −2.8 | 0.59 |
| 3 | F4 TIPS Pn | 0.02 | −2.7 | 1.0 |

Comparative organic thin film transistors were also prepared according to the Example 1, the difference being that the deposited small molecule semiconductor solutions were not subjected to vibration during drying. The current-voltage characteristics of the Comparative organic thin film transistors are provided in Table VIII.

TABLE VIII

Comparative Organic Thin Film Transistors

| Organic Thin Film Transistor | Small Molecule Semiconductor of Drop Cast Film | μ (cm²/Vs) | $V_T$ [V] | S [V dec$^{-1}$] |
|---|---|---|---|---|
| 4 | TES-ADT | 0.11 | −6.2 | 0.7 |
| 5 | diF-TIPS ADT | 0.03 | −3.2 | 0.82 |
| 6 | F4 TIPS Pn | 0.006 | −3.2 | 1.3 |

From the foregoing data, vibrationally-assisted organic thin film transistors 1-3 demonstrated superior performance to comparative organic thin film transistors 4-6.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. An organic thin film transistor comprising:
   a source terminal, a drain terminal and a gate terminal;
   a dielectric layer positioned between the gate terminal and the source and drain terminals; and
   an organic film comprising small molecule semiconductor in electrical communication with the source terminal and drain terminal,
   wherein the organic thin film transistor has an interfacial trap density of less than $1E^{12}$ cm$^{-2}$-eV$^{-1}$ and a work function alteration layer is positioned between at least one of the source terminal or drain terminal and the organic film.

2. The organic thin film transistor of claim 1, wherein the interfacial trap density is less than $1E^{11}$ cm$^{-2}$-eV$^{-1}$.

3. The organic thin film transistor of claim 1, wherein the interfacial trap density is 1-9$E^{11}$ cm$^{-2}$-eV$^{-1}$.

4. The organic thin film transistor of claim 1, wherein the interfacial trap density is 3-8$E^{11}$ cm$^{-2}$-eV$^{-1}$.

5. The organic thin film transistor of claim 1, wherein the interfacial trap density is 4-7$E^{11}$ cm$^{-2}$-eV$^{-1}$.

6. The organic thin film transistor of claim 1, wherein the interfacial trap density is 5-9$E^{11}$ cm$^{-2}$-eV$^{-1}$.

7. The organic thin film transistor of claim 1, wherein the work function alteration layer is positioned between the source terminal and the organic film, and between the drain terminal and the organic film.

8. The organic thin film transistor of claim 1, wherein the small molecule semiconductor comprises one or more substituted or unsubstituted acenes selected from a group consisting of naphthalene, anthracene, tetracene, pentacene, hexacene, and heptacene.

9. The organic thin film transistor of claim 1, wherein the small molecule semiconductor comprises a structure of Formula (I):

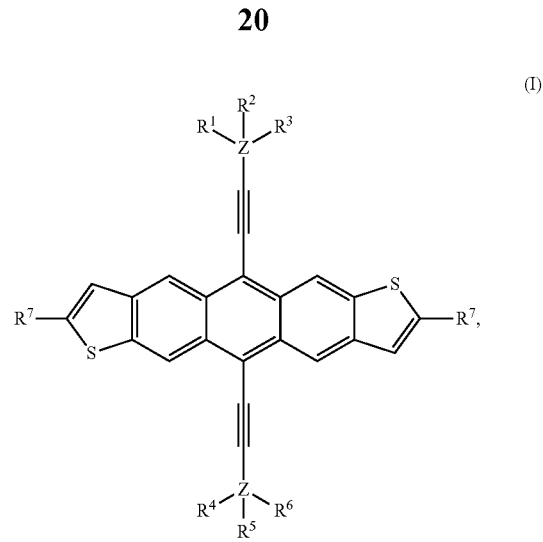

wherein Z is selected from the group consisting of Si and Ge,
$R^1$-$R^6$ are independently selected from the group consisting of $C_{1-20}$ alkyl and $C_{1-20}$ alkenyl, and
$R^7$ is selected from a group consisting of F, H, —CN.

10. The organic thin film transistor of claim 1, wherein the small molecule semiconductor comprises 2,8-difluoro-5,11-bis(triethylsilylethynyl)anthradithiophene [diF-TES-ADT], 2,8-difluoro-5,11-bis(triisopropylsilylethynyl) anthradithiophene [diF-TIPS-ADT], triethylgermylethynyl-substituted anthradithiophene [diF-TEG ADT], 2,8-difluoro-5,11-bis (tri-sec-butylsilylethynyl)difluoro anthradithiophene, or any combination thereof.

11. The organic thin film transistor of claim 1, wherein the small molecule semiconductor comprises a structure of Formula (II):

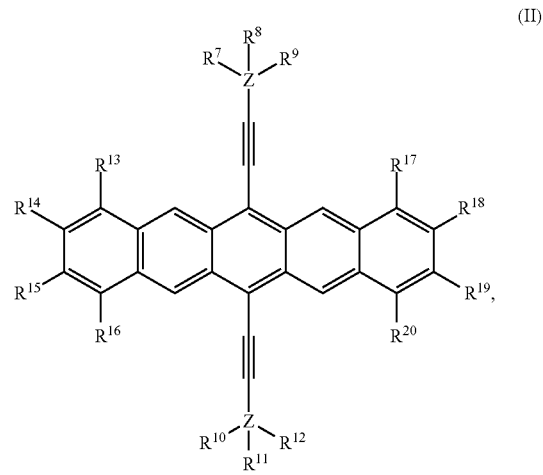

wherein Z is selected from the group consisting of Si and Ge,
$R^7$-$R^{12}$ are independently selected from the group consisting of $C_{1-20}$ alkyl and $C_{1-20}$ alkenyl, and
$R^{13}$-$R^{20}$ are independently selected from the group consisting of hydrogen, halogen, cyano, alkyl, alkenyl, alkynyl, aryl and heteroaryl.

12. The organic thin film transistor of claim 1, wherein the small molecule semiconductor comprises 6,13-bis(triisopropylsilylethynyl)pentacene, 1,2,3,4-tetrafluoro-5,11-bis(triisopropylsilylethynyl)pentacene [F4 TIPS Pn], F2 TIPS Pn, F8 TIPS Pn, or any combination thereof.

13. The organic thin film transistor of claim 1, wherein the small molecule semiconductor comprises a structure of Formula (III):

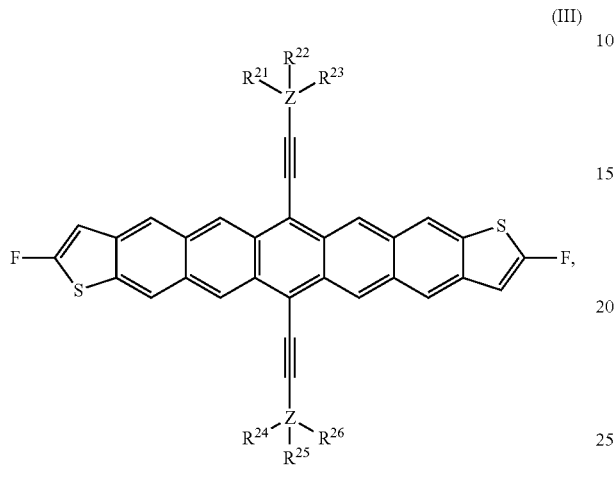

(III)

wherein Z is selected from the group consisting of Si and Ge, and $R^{21}$-$R^{26}$ are independently selected from the group consisting of $C_{1-20}$ alkyl and $C_{1-20}$ alkenyl.

14. The organic thin film transistor of claim 1, wherein the small molecule semiconductor comprises 2,8-difluoro-5,11-bis(tri-sec-butylsilylethynyl) pentacenedithiophene.

15. The organic thin film transistor of claim 1, wherein the small molecule semiconductor comprises a structure of Formula (IV):

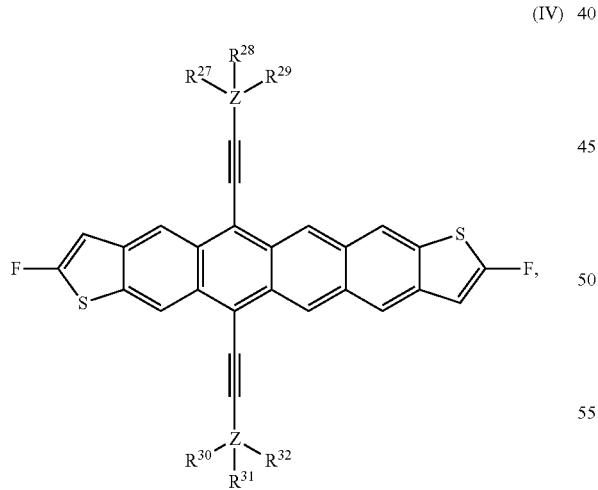

(IV)

wherein Z is selected from the group consisting of Si and Ge, and $R^{27}$-$R^{32}$ are independently selected from the group consisting of $C_{1-20}$ alkyl and $C_{1-20}$ alkenyl.

16. An organic thin film transistor comprising:
a source terminal, a drain terminal and a gate terminal;
a dielectric layer positioned between the gate terminal and the source and drain terminals; and
an organic film comprising small molecule semiconductor in electrical communication with the source terminal and drain terminal,
wherein the organic thin film transistor has an interfacial trap density of less than $1E^{12}$ cm$^{-2}$–eV$^{-1}$ and the small molecule semiconductor comprises a structure of Formula (I):

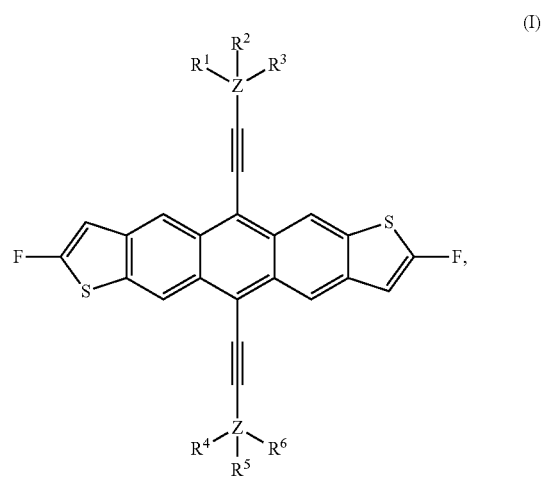

(I)

wherein Z is selected from the group consisting of Si and Ge, $R^1$-$R^6$ are independently selected from the group consisting of $C_{1-20}$ alkyl and $C_{1-20}$ alkenyl, and $R^7$ is selected from a group consisting of F, H, —CN.

17. An organic thin film transistor comprising:
a source terminal, a drain terminal and a gate terminal;
a dielectric layer positioned between the gate terminal and the source and drain terminals; and
an organic film comprising small molecule semiconductor in electrical communication with the source terminal and drain terminal,
wherein the organic thin film transistor has an interfacial trap density of less than $1E^{12}$ cm$^{-2}$–eV$^{-1}$ and the small molecule semiconductor comprises a structure of Formula (II):

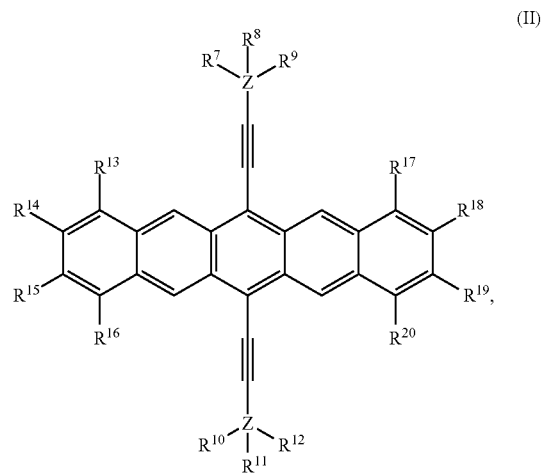

(II)

wherein Z is selected from the group consisting of Si and Ge, $R^7$-$R^{12}$ are independently selected from the group consisting of $C_{1-20}$ alkyl and $C_{1-20}$ alkenyl, and $R^{13}$-$R^{20}$ are independently selected from the group consisting of hydrogen, halogen, cyano, alkyl, alklenyl, alkynyl, aryl and heteroaryl.

18. An organic thin film transistor comprising:

a source terminal, a drain terminal and a gate terminal;

a dielectric layer positioned between the gate terminal and the source and drain terminals; and an organic film comprising small molecule semiconductor in electrical communication with the source terminal and drain terminal, wherein the organic thin film transistor has an interfacial trap density of less than $1E^{12}$ cm$^{-2}$–eV$^{-1}$ and the small molecule semiconductor comprises a structure of Formula (III):

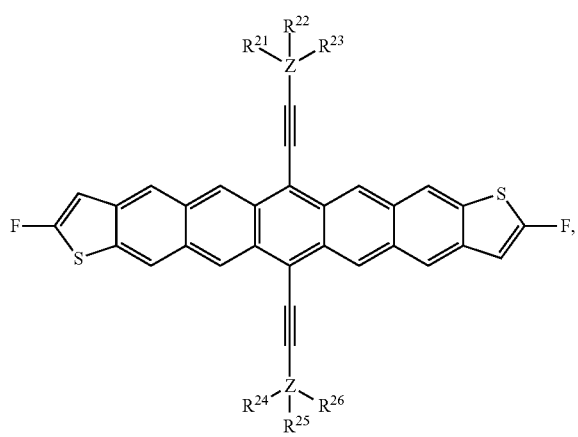

(III)

wherein Z is selected from the group consisting of Si and Ge, and $R^{21}$-$R^{26}$ are independently selected from the group consisting of $C_{1-20}$ alkyl and $C_{1-20}$ alkenyl.

19. An organic thin film transistor comprising:

a source terminal, a drain terminal and a gate terminal;

a dielectric layer positioned between the gate terminal and the source and drain terminals; and an organic film comprising small molecule semiconductor in electrical communication with the source terminal and drain terminal, wherein the organic thin film transistor has an interfacial trap density of less than $1E^{12}$ cm$^{-2}$–eV$^{-1}$ and the small molecule semiconductor comprises a structure of Formula (IV):

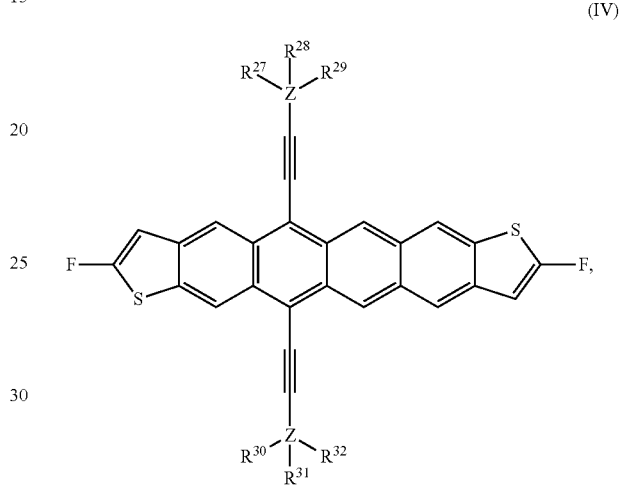

(IV)

wherein Z is selected from the group consisting of Si and Ge, and $R^{27}$-$R^{32}$ are independently selected from the group consisting of $C_{1-20}$ alkyl and $C_{1-20}$ alkenyl.

* * * * *